(12) United States Patent
Showcatally et al.

(10) Patent No.: US 9,635,775 B2
(45) Date of Patent: Apr. 25, 2017

(54) SEALED END POINTS AND METHODS OF MAKING THE SAME

(71) Applicant: Itron, Inc., Liberty Lake, WA (US)

(72) Inventors: Shawn Showcatally, Mankato, MN (US); Nathan Allen Van Roekel, Owatonna, MN (US); Jason Robert Woodruff, Mankato, MN (US)

(73) Assignee: Itron, Inc., Liberty Lake, WA (US)

( * ) Notice: Subject to any disclaimer, the term of this patent is extended or adjusted under 35 U.S.C. 154(b) by 158 days.

(21) Appl. No.: 14/570,926

(22) Filed: Dec. 15, 2014

(65) Prior Publication Data

US 2016/0174405 A1 Jun. 16, 2016

(51) Int. Cl.
| | |
|---|---|
| *B32B 37/00* | (2006.01) |
| *H05K 5/06* | (2006.01) |
| *B23K 20/12* | (2006.01) |
| *B23K 20/22* | (2006.01) |
| *B29C 65/06* | (2006.01) |

(Continued)

(52) U.S. Cl.
CPC ......... *H05K 5/069* (2013.01); *B23K 20/1205* (2013.01); *B23K 20/22* (2013.01); *B29C 65/0672* (2013.01); *G01D 11/24* (2013.01); *G01D 11/245* (2013.01); *H05K 5/03* (2013.01); *B23K 2203/05* (2015.10); *B23K 2203/30* (2015.10); *B23K 2203/42* (2015.10); *B23K 2203/50* (2015.10); *B29K 2101/12* (2013.01); *B29K 2995/0067* (2013.01); *B29L 2031/3481* (2013.01)

(58) Field of Classification Search
CPC .......... H05K 5/069; H05K 5/03; B23K 20/22; B29C 65/0672; G01D 11/24; G01D 11/245

USPC .......... 156/69, 73.5; 228/114.5, 2.3
See application file for complete search history.

(56) References Cited

U.S. PATENT DOCUMENTS

| | | | |
|---|---|---|---|
| 4,577,776 A | 3/1986 | Rayner et al. | |
| 6,588,618 B1 * | 7/2003 | Davis | B44D 3/127 220/254.7 |

(Continued)

FOREIGN PATENT DOCUMENTS

| | | |
|---|---|---|
| CN | 201717766 | 1/2011 |
| WO | 2014073587 | 5/2014 |

OTHER PUBLICATIONS

Patent Cooperation Treaty, "International Search Report", issued in connection with PCT Patent Application No. PCT/US2015/060736, mailed on Feb. 10, 2016, 6 pages.

(Continued)

*Primary Examiner* — James Sells
(74) *Attorney, Agent, or Firm* — Hanley, Flight & Zimmerman, LLC (57) ABSTRACT

Sealed end points and methods of making the same are disclosed. An example method includes disposing a first flange of a lid within a groove of a housing. The groove is defined by first and second walls of the housing and lid. The method also includes means for welding two stationary components while rotating a third component to weld the three components together. The second flange is positioned between the first flange and the first wall. The housing, the lid, and the collar include a thermoplastic material. The method includes securing the housing and the lid relative to one another and spin welding the housing, the lid, and the collar.

11 Claims, 9 Drawing Sheets

(51) Int. Cl.
*H05K 5/03* (2006.01)
*G01D 11/24* (2006.01)
*B23K 103/04* (2006.01)
*B23K 103/00* (2006.01)
*B29K 101/12* (2006.01)
*B29L 31/34* (2006.01)

(56) References Cited

U.S. PATENT DOCUMENTS

| | | | |
|---|---|---|---|
| 6,964,348 B2 * | 11/2005 | Breimon | B65D 21/022 206/508 |
| 2005/0178715 A1 | 8/2005 | Thomas et al. | |
| 2008/0156803 A1 * | 7/2008 | McClellan | A47J 41/0011 220/254.1 |

OTHER PUBLICATIONS

Patent Cooperation Treaty, "Written Opinion", issued in connection with PCT Patent Application No. PCT/US2015/060736, mailed on Feb. 10, 2016, 6 pages.

\* cited by examiner

SEALED END POINTS AND METHODS OF MAKING THE SAME

FIELD OF THE DISCLOSURE

This disclosure relates generally to sealed end points and, more particularly, the methods of making the same.

BACKGROUND

Utility providers install, maintain, and/or collect utility usage data from endpoints within automatic meter reading (AMR) collection networks. These endpoints are data collection and transmitting devices that are either installed on existing utility meters or are integrated into the utility meters. Often, the endpoints communicate with data collection units (DCU) through radio frequency (RF) communication. Some endpoints transmit meter data at periodic intervals without any external prompting.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

The examples disclosed herein relate to sealed end points (e.g., water based end points, hermetically sealed end points) and methods of making such end points. In some examples, the example end points are disposed in a water pit and coupled (e.g., physically and/or communicatively coupled) to a utility meter (e.g., water meter) to enable consumption data from the utility meter to be conveyed from the water pit to, for example, a data collection unit. Because water based end points are disposed in a water pit in operation, some end points have a tendency of failing when water permeates the end point and condensates on electronic components contained within the end point.

In contrast to these end points, the examples disclosed herein are sealed (e.g., hermetically sealed) using an example spin welding procedure. The example sealed (e.g., hermetically sealed) end points substantially reduces the moisture vapor rate permeating the end point through mating component joints of the end point, thereby substantially avoiding the failures encountered with some known end points.

In some examples, the example end points are produced using an example spin welding procedure that includes fixing and/or rotatably securing a housing relative to a lid and inserting a rotatable collar into a groove defined by the housing and the lid. To spin weld the housing, the lid and/or the collar in accordance with the examples disclosed herein, the collar may be rotated relative to and driven against the housing and/or the lid to heat the respective parts until the collar is welded and/or coupled to the housing and the lid. The collar may include inner and outer chamfers that form an interference fit that creates friction between the respective components during the example spin welding procedure. As the chamfers are driven against the housing and the lid during the example spin welding procedure, a coupling and/or joint (e.g., a shear joint, a compression joint, a tensile joint) is formed between the housing, the lid and/or the collar. In some examples, the coupling between the collar and the housing and between the collar and the lid provides a hermetic seal(s) that substantially prevent moisture vapor, etc. from entering the end point.

Figure 1:
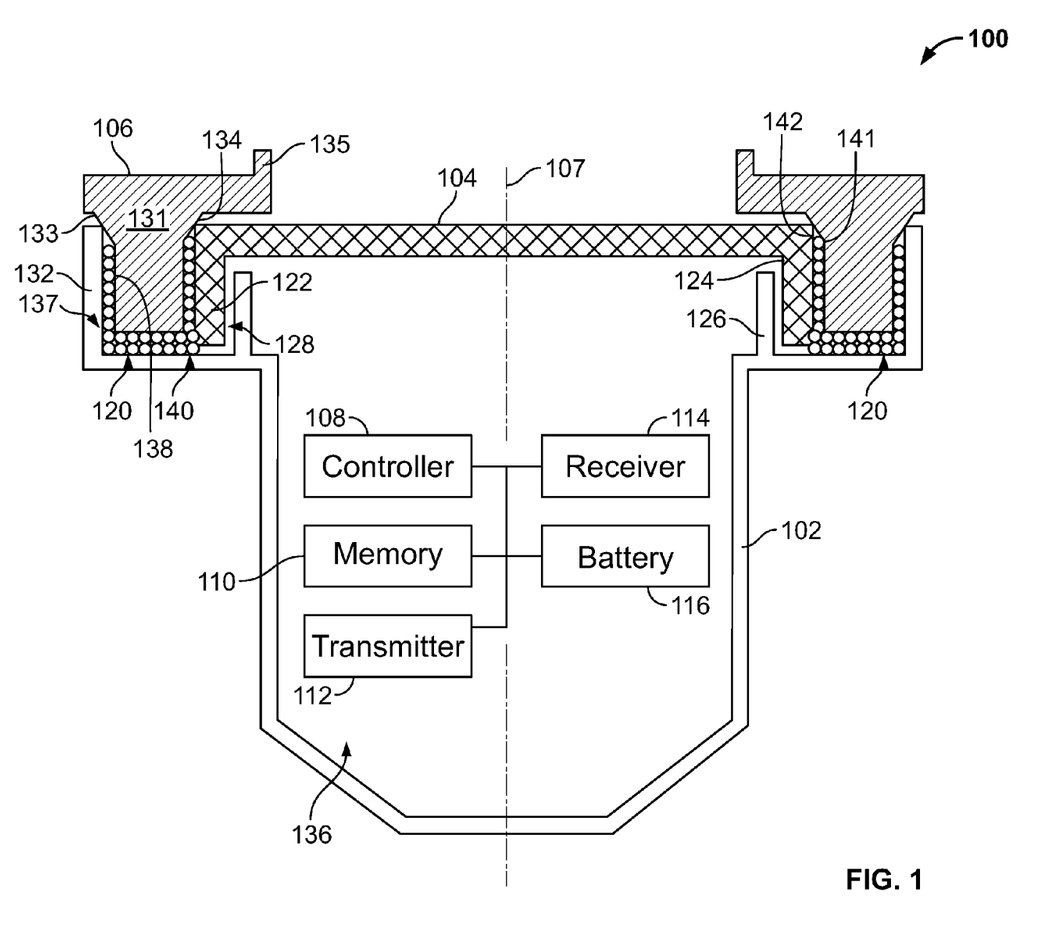
FIG. 1 illustrates an example sealed end point that may be produced using an example spin welding procedure disclosed herein.

FIG. 1 illustrates an example end point 100 that includes a first portion and/or housing 102, a second portion, cap and/or lid 104 and a third portion/or collar 106. In this example, the end point 100 includes components (e.g., a controller 108, a memory 110, a transmitter 112, a receiver 114 and a battery 116) that enable the end point 100 to receive and/or transmit data relating to, for example, water consumption. The housing 102, the lid 104 and/or the collar 106 may be made of a thermoplastic material, a stainless steel material, a metal material, a plastic material, a rubber material, a non-thermoset material, material(s) capable of flowing (e.g., liquefying under heat) and resolidifying (e.g., wax, thermoplastic, metal), and/or a liquid crystal polymer(s). However, the housing 102, the lid 104 and/or the collar 106 may be made of any suitable material. The housing 102, the lid 104 and/or the collar 106 may be made of the same or a different compatible material(s).

In the illustrated example, the housing 102 defines a groove 120 into which a first flange 122 of the lid 104 is disposed. To substantially prevent the lid 104 from rotating relative to the housing 102, in some examples, an inwardly facing surface 124 of the lid 104 and an interior wall 126 of the housing 102 defining the groove 120 include corresponding surface structures (e.g., ribs, clips, tongue-and-groove) 128 that interact to, for example, rotationally fix the lid 104 relative to the housing 102. In the illustrated, the collar 106 includes a second flange 131 that extends into the groove 120 and is disposed between an exterior wall 132 of the housing 102 defining the groove 120 and the first flange 122. In this example, inner and outer chamfers 133, 134 are disposed on the second flange 131 and form an interference fit between the housing 102 and the lid 104.

In this example, the collar 106 also includes a distal end 135 that extends in a direction opposite the second flange 131. In some examples, the distal end 135 has a hexagonal cross-section that enables the collar 106 to be coupled to the spin welding fixture used during the example spin welding procedure. For example, the cross-sectional shape of the distal end 135 may facilitate coupling with a rotary device that rotates the collar 106 relative to the housing 102 and the lid 104 to spin weld the housing 102, the lid 104 and the collar 106 and form a hermetic seal(s) between the housing 102, the lid 104 and/or the collar 106. The hermetic seal(s) substantially prevents moisture, water, etc. from entering a cavity 136 formed by the housing 102 and/or the lid 104 and in which the controller 108, the memory 110, the transmitter 112, the receiver 114 and/or the battery 116 are disposed, in the illustrated example.

In this example, during an example spin welding procedure in which the collar 106 is rotated relative to the housing 102 and/or the lid 104, a first coupling (e.g., a plastic weld) 137 forms between an exterior surface 138 of the second flange 131 and the exterior wall 132 and a second coupling (e.g., a plastic weld) 140 forms between an interior surface 141 of the second flange 131 and an exterior surface 142 of the first flange 122. Specifically, in some examples, an interaction and/or interference fit between the outer chamfer 133 and the exterior wall 132 creates friction that forms the first coupling and/or joint (e.g., a shear joint) 137 between the housing 102 and the collar 106. Additionally, in some examples, an interaction and/or interference fit between the inner chamfer 134 and the first flange 122 creates friction that forms the second coupling and/or joint (e.g., a shear joint) 140 between the lid 104 and the collar 106. The coupling 137 and/or 140 may be substantially parallel to a longitudinal axis of the first flange 122 to form a shear joint(s) and/or the couplings 137 and/or 140 may be substantially perpendicular to the longitudinal axis of the first flange 122 to form a tensile and/or compressive joint(s).

Figure 2:
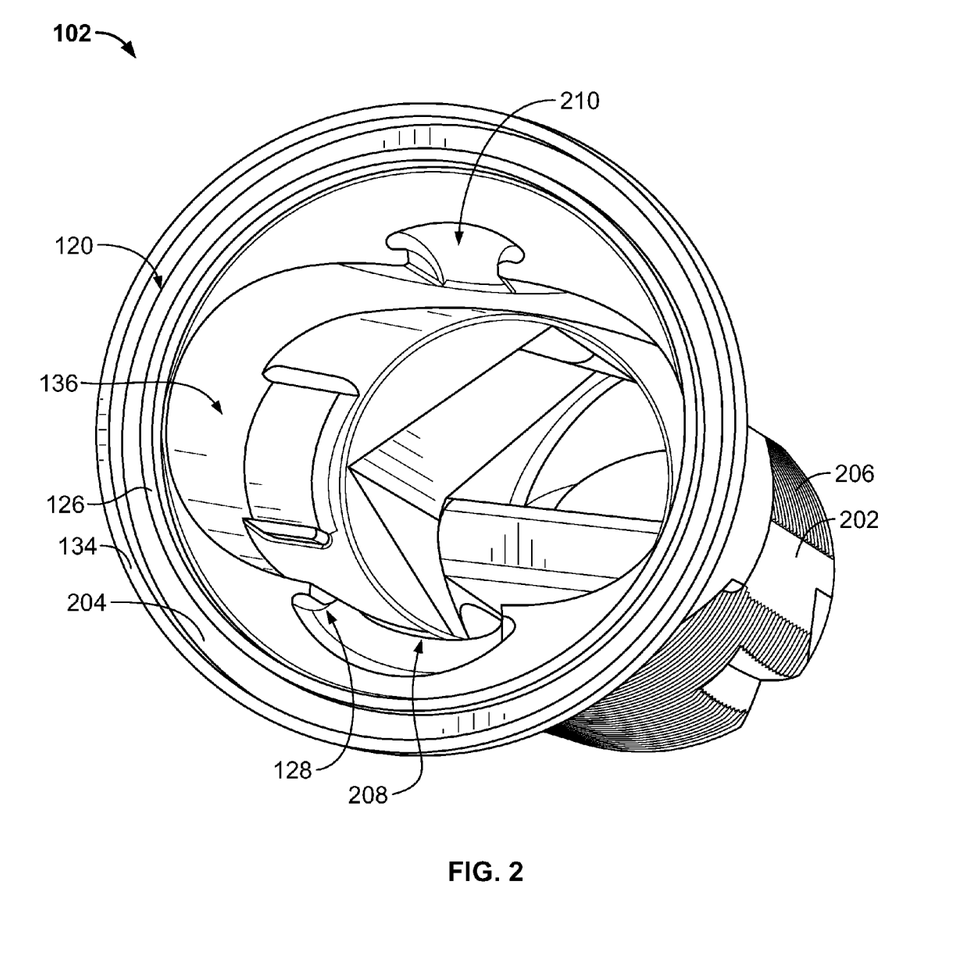
FIG. 2 illustrates an isometric view of an example housing of the end point of FIG. 1.
Figure 3:
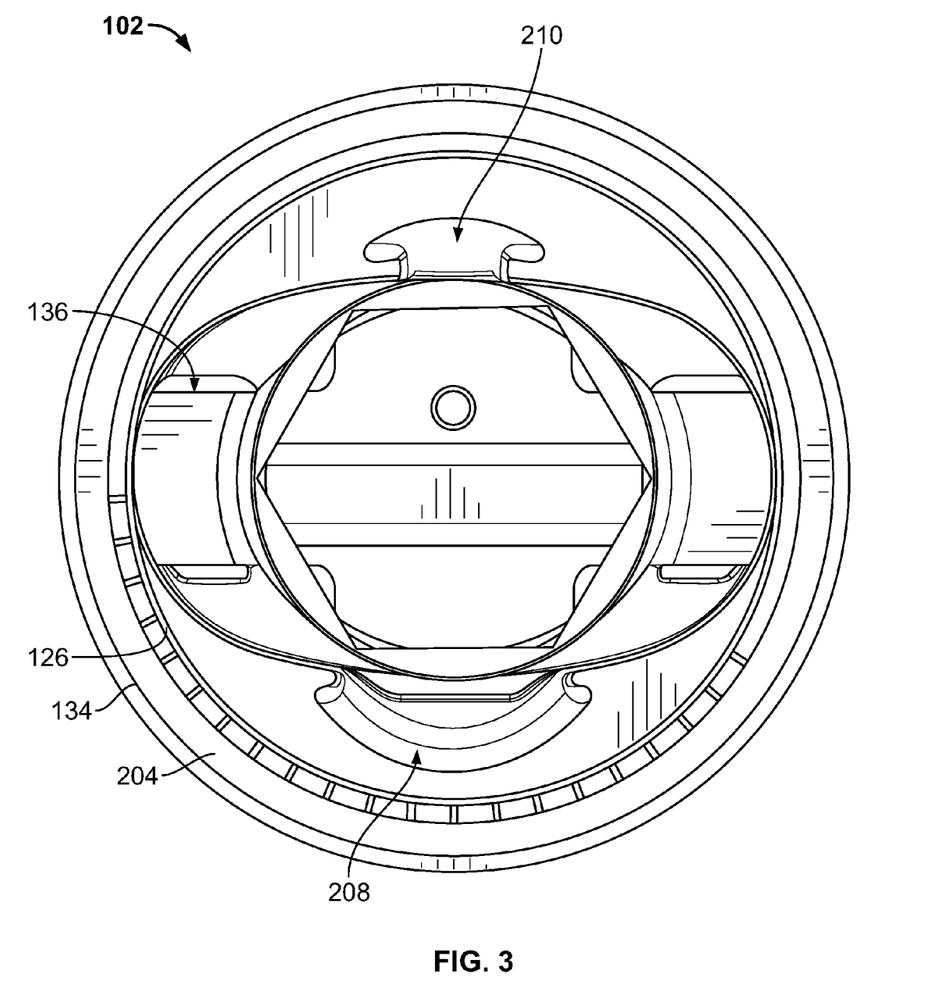
FIG. 3 illustrates a top view of the example housing of the end point of FIG. 1.

FIGS. 2 and 3 illustrate an isometric view and a top view of the housing 102. In the illustrated example, the housing 102 includes an elongated portion 202 and a flange 204 that extends from the elongated portion 202. In this example, threads 206 are defined on the elongated portion 202 to enable, for example, the housing 102 to be coupled to and/or partially positioned within a corresponding utility meter (e.g., water meter). As shown in FIGS. 2 and 3, the elongated portion 202 and/or the flange 204 define the cavity 136 and the interior and exterior walls 126, 132 define the groove 120 therebetween.

To enable the lid 104 to be rotationally secured relative to the housing 102, in this example, the surface structures 128 include grooves 208, 210 defined by the housing 102. In some examples, to rotationally secure the lid 104 relative to the housing 102, the grooves 208, 210 receive a correspondingly-shaped tongue and/or protrusion 402, 403 (FIG. 4) of the lid 104. While the illustrated example shows the housing 102 having two differently shaped grooves 208, 210 to facilitate the coupling between the housing 102 and the lid 104, the grooves may have a similar or the same shape, the housing 102 may have a different number of grooves (e.g., 1, 3, 4, etc.) and/or different and/or additional structures (e.g., ribs, clips, etc.) to facilitate the coupling between the housing 102 and the lid 104.

Figure 4:
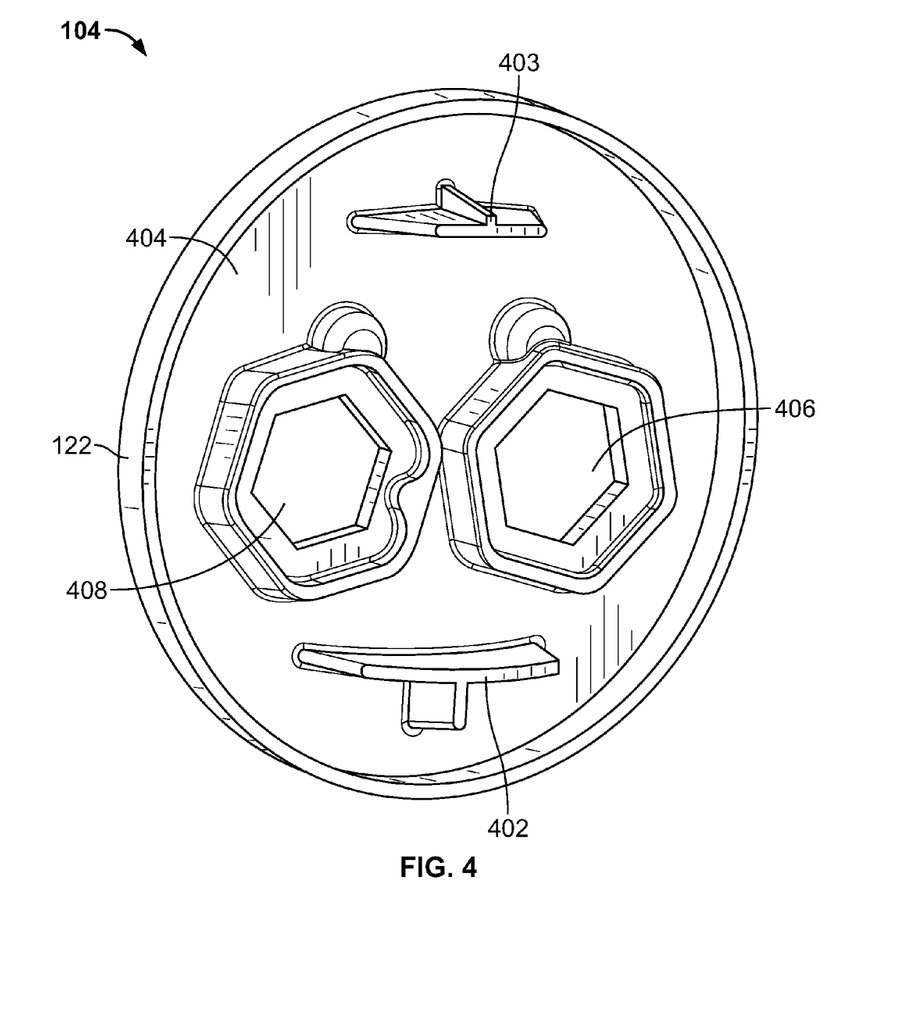
FIG. 4 illustrates a bottom isometric view of an example lid of the example end point of FIG. 1.
Figure 5:
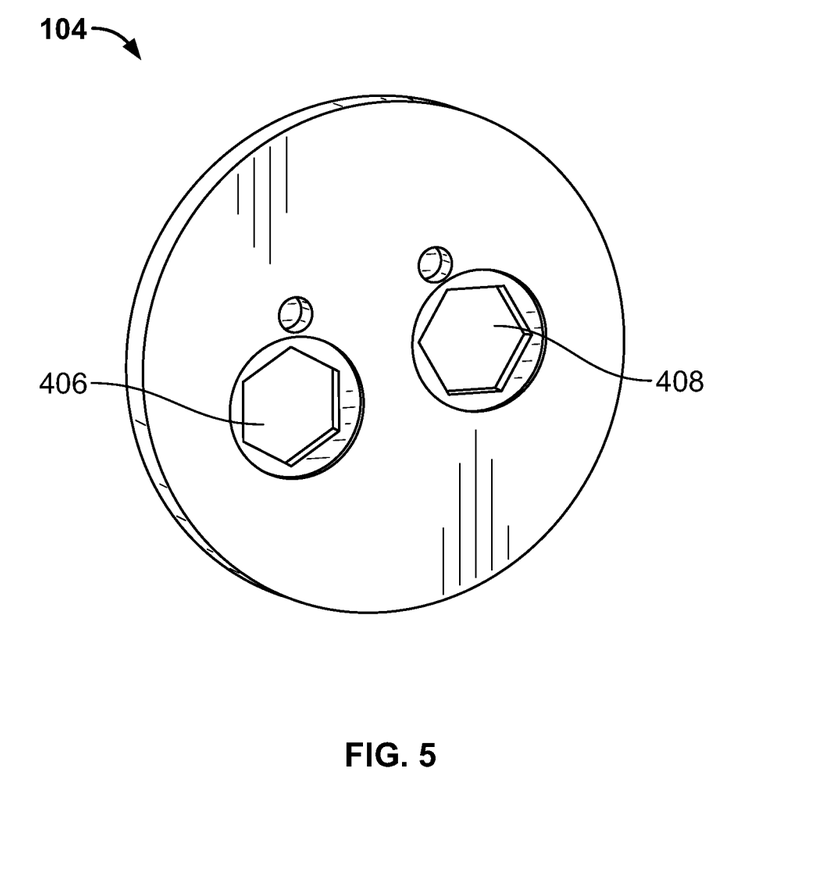
FIG. 5 illustrates a top isometric view of the example lid of the example end point of FIG. 1.

FIG. 4 illustrates an isometric bottom view of the lid 104 and FIG. 5 illustrates an isometric top view of the lid 104. In the illustrated example, the lid 104 includes a top 404, the first flange 122, the tongue and/or t-shaped protrusion(s) 402, 403 and first and second apertures 406, 408. In operation, terminals and/or connections (e.g., electrical connections) may extend through the first and second apertures 406, 408 to enable the end point 100 to be coupled to, for example, a utility meter (e.g., water meter) and/or to otherwise communicate (e.g., wirelessly) with another device.

Figure 6:
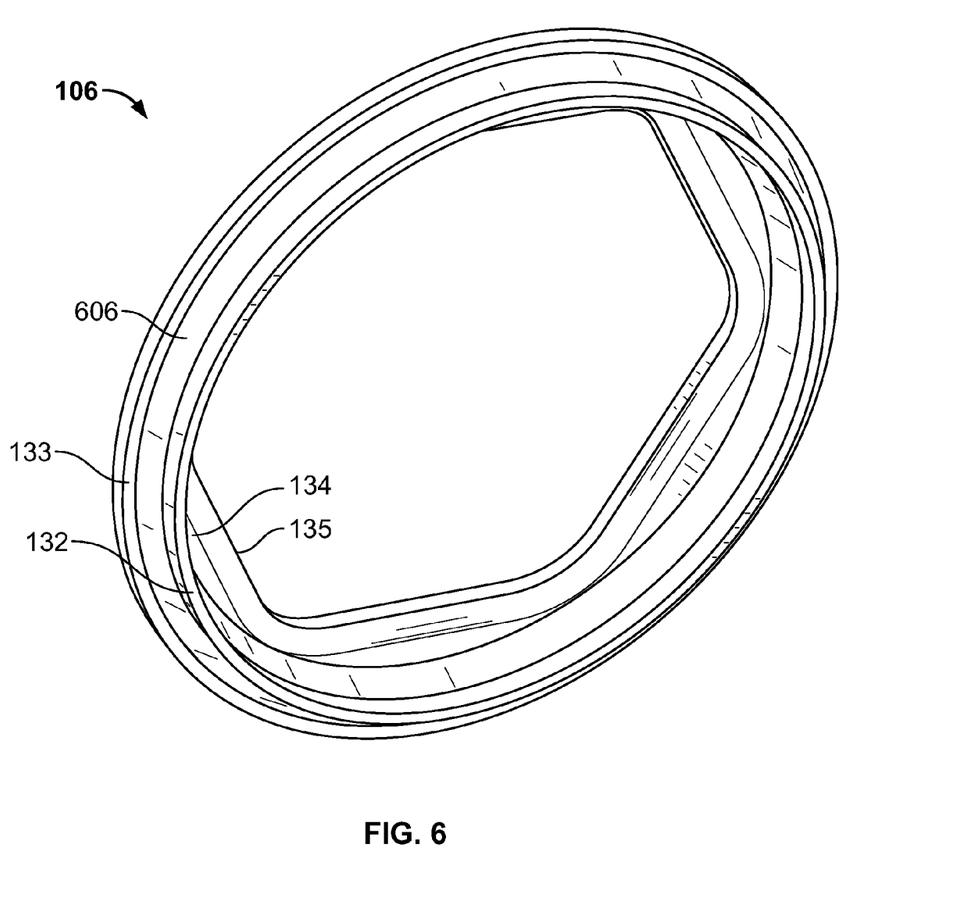
FIG. 6 illustrates a bottom isometric view of an example collar of the example end point of FIG. 1.
Figure 7:
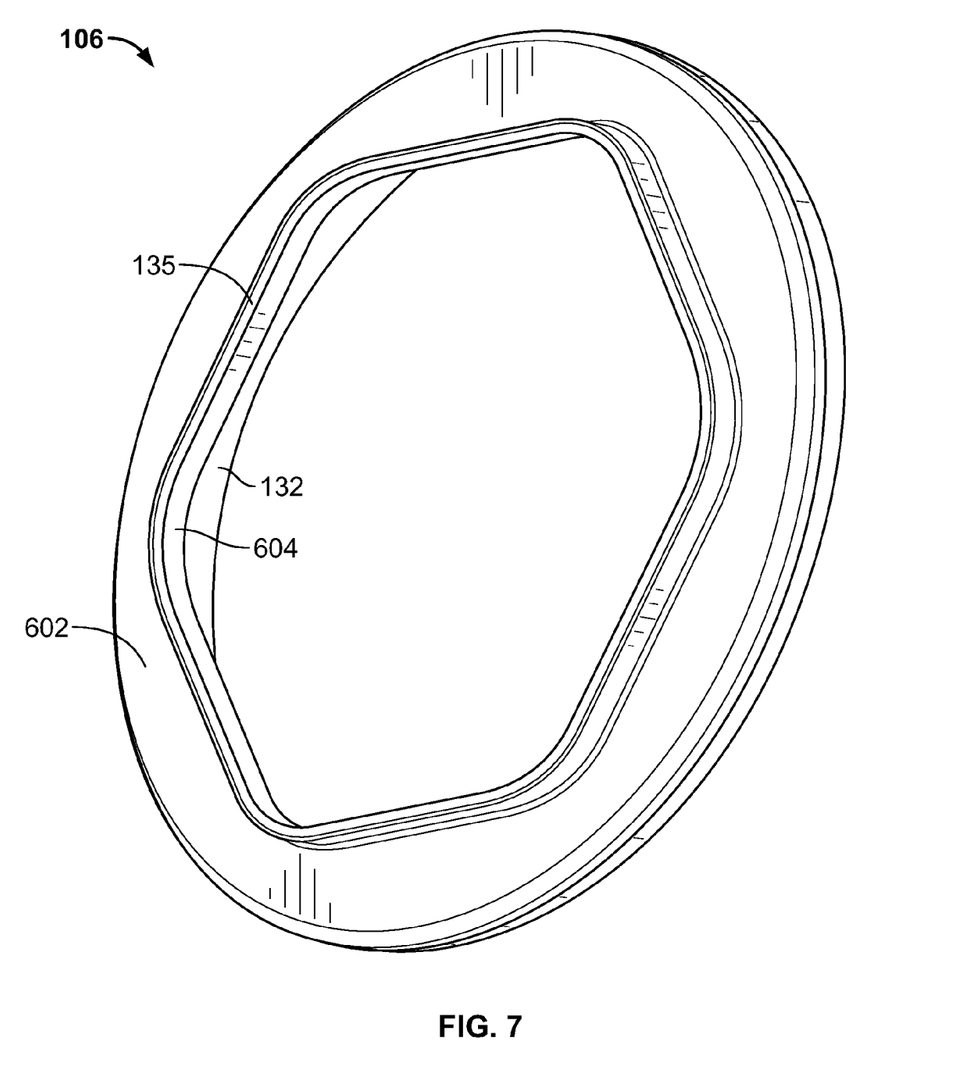
FIG. 7 illustrates a top isometric view of the example collar of the example end point of FIG. 1.

FIG. 6 illustrates an isometric bottom view of the collar 106 and FIG. 7 illustrates an isometric top view of the collar 106. In this example, the collar 106 includes a base 602, the second flange 131, the distal end 135 and an aperture 604 that enables access to, for example, terminals and/or connections (e.g., electrical connections) that may extend from the lid 104. In this example, the distal end 135 has a cross-section (e.g., a hexagonal cross-section) that enables the collar 106 to be coupled to the spin welding fixture, which rotates the collar 106 relative to the housing 102 and/or the lid 104 during an example spin welding procedure.

The collar 106 may have different shapes, structures and/or features to facilitate the example spin welding procedure. For example, the second flange 131 includes the contours and/or chamfers 133, 134 immediately adjacent the base 602 that are configured to form an interference fit between the housing 102 and the lid 104 when the second flange 131 is disposed in the groove 120. Additionally, while the second flange 131 is illustrated as extending from the base 602 substantially perpendicularly, the second flange 131 may extend from the base 602 at any angle and/or have any suitable cross-section and/or contours to be received and/or matingly engage corresponding surfaces defining and/or defined by the groove 120, the first flange 122, the lid 104 and/or the housing 102.

Figure 8:
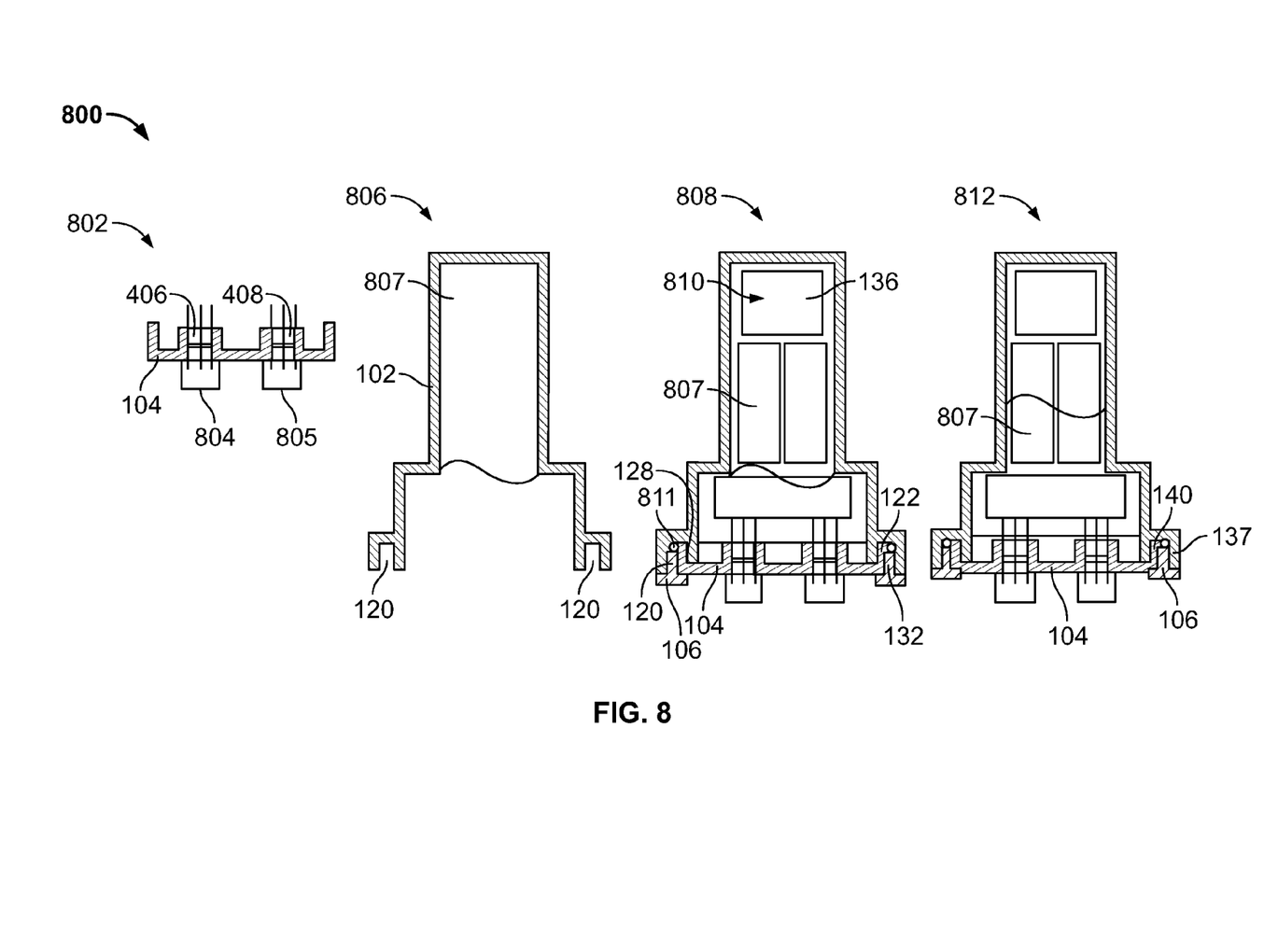
FIG. 8 is a diagram illustrating example stages of producing the example end point of FIG. 1 using an example spin welding procedure as disclosed herein.

FIG. 8 illustrates an example diagram 800 illustrating example stages of producing the example end point 100 in accordance with the examples disclosed herein. At 802, the lid 104 is illustrated with a first terminal 804 extending from the first aperture 406 and a second terminal 805 extending from the second aperture 408. At 806, the housing 102 defining the groove 120 is illustrated including potting and/or impact resistant material 807. The potting 807 may substantially prevent the memory 110, the transmitter 112, the receiver 114 and/or the battery 116 from being damaged during, for example, an impact of the end point 100.

At 808, the housing 102 is illustrated with one or more components 810 disposed within the cavity 136 and the first and second flanges 122, 131 disposed in the groove 120. The components 810 may include the memory 110, the transmitter 112, the receiver 114 and/or the battery 116. The surface structures 128 of the lid 104 and the housing 102 are shown interacting at 808 to rotationally secure the lid 104 relative to the housing 102. In this example, epoxy or reactive hotmelt or other sealant is shown disposed in the groove 120 to further ensure a hermetic seal(s) is attained after the example spin welding procedure. However, in other examples, the sealant 811 is not included.

To create the couplings 137, 140 between the housing 102, the lid 104 and/or the collar 106, as shown at 812, the housing 102 and the lid 104 are secured in place while the collar 106 is rotated relative to and driven against the housing 102 and the lid 104. The interaction between the collar 106 and the housing 102 and the lid 104 and, specifically, between the chamfers 133, 134 and the housing 102 and the lid 104, creates friction that melts a portion of the housing 102, the lid 104, the collar 106. The created friction fuses the housing 102, the lid 104 and/or the collar 106 relative to one another.

Further, rotation of the collar 106 relative to the housing 102 and the lid 104 increases the temperature and/or viscosity of the sealant 811. In some examples, increasing the viscosity of the sealant 811 encourages movement and/or distribution of the sealant 811 within the groove 120 and onto and/or between the housing 102, the lid 104 and/or the collar 106. In some examples, increasing the temperature of the sealant 811 decreases a cure time for the sealant 811. In this example, because the couplings 137, 140 secure the housing 102, the lid 104 and the collar 106 relative to one another, no additional devices (e.g., external clamps) may be used to fix the housing 102, the lid 104 and the collar 106 relative to one another as the sealant 811 sets. Thus, using the examples disclosed herein, the equipment used to perform the example spin welding procedure may have higher productivity because the equipment may not have to wait for the sealant 811 to cure prior to performing a subsequent spin welding procedure. The sealant 811 may form a coupling (e.g., a shear joint, a tensile joint, a compressive joint) between the housing 102, the lid 104 and the collar 106. However, in other examples, the collar 106 may not include the chamfers 133, 134, and the housing 102, the lid 104 and the collar 106 may be otherwise secured while the sealant 811 sets.

Figure 9:
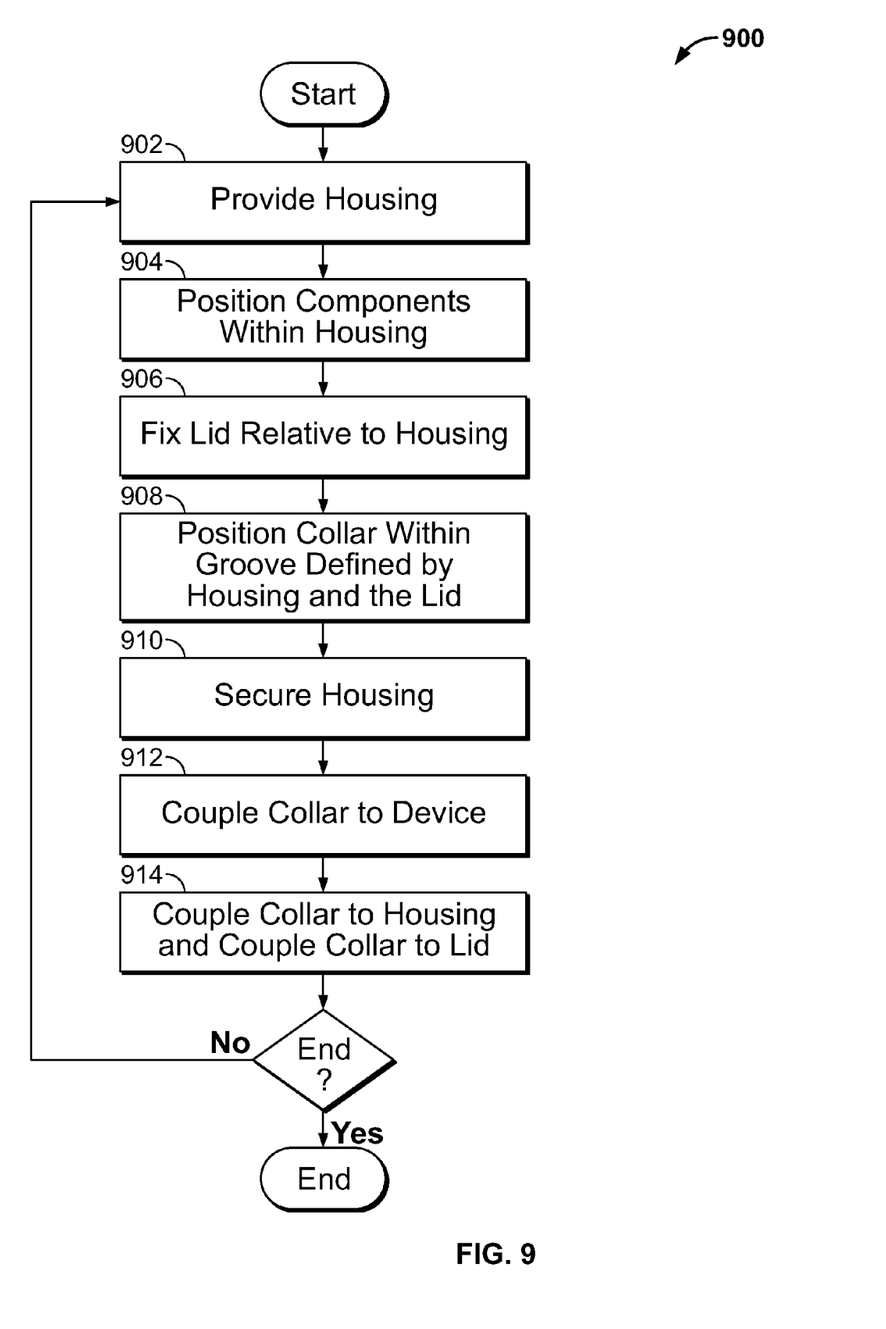
FIG. 9 is a flowchart of an example spin welding procedure to manufacture an example end point disclosed herein.

FIG. 9 is a flowchart of an example method 900 that may be used to manufacture an end point such as the example end point 100 of FIG. 1. While an example manner of manufacturing the example end point has been illustrated in FIG. 9, one or more of the steps and/or processes illustrated in FIG. 9 may be combined, divided, re-arranged, omitted, eliminated and/or implemented in any other way. Further still, the example method of FIG. 9 may include one or more processes and/or steps in addition to, or instead of, those illustrated in FIG. 9, and/or may include more than one of any or all of the illustrated processes and/or steps. Further, although the example method is described with reference to the flow chart illustrated in FIG. 9, many other methods of manufacturing the example end point 100 may alternatively be used.

To begin the example manufacturing process of FIG. 9, the example housing 102 including the interior and exterior walls 126, 132 that define the groove 120 is provided (block 902). The electronic components are positioned within the cavity 136 of the housing 102 (block 904). In the illustrated example of FIG. 1, the electronic components include the memory 110, the transmitter 112, the receiver 114 and/or the battery 116. However, different electronic components may be included that provide end point functionality.

The lid 104 is fixed (e.g., rotationally fixed) relative to the housing 102 (block 906). In the illustrated examples of FIGS. 2-5, to fix the lid 104 relative to the housing 102, the lid 104 includes protrusions 402, 403 that are received in the correspondingly sized grooves 208, 210 of housing 102. Further, in the illustrated example, when the lid 104 is fixed relative to the housing 102, the first flange 122 is positioned within the groove 120 of the housing 102 and surrounds the interior wall 126 of the housing 102.

The second flange 131 of the collar 106 is positioned within the groove 120 of the housing 102 between the first flange 122 of the lid 104 and the exterior wall 132 of the housing (block 908). The housing 102 is secured within, for example, a clamp that substantially prevents the housing 102 from rotating (block 910). In some examples, the clamp substantially prevents the exterior wall 132 from splaying outwardly during the example spin welding procedure. The distal end 135 of the collar 106 is coupled to a device (e.g., a spin welding fixture, a chuck of a lathe, mill, drill press, etc.) capable of rotating the collar 106 relative to, for example, the housing 102 and the lid 104 (block 912). The first coupling 137 is formed between the housing 102 and the collar 106 and the second coupling 140 is formed between the lid 104 and the collar 106 (block 914). In some examples, the couplings 137, 140 are formed by an example spin welding procedure that rotates and drives the chamfers 133, 134 of the collar 106 against the housing 102 and the lid 104 to melt the material (e.g., thermoplastic material, liquid crystal polymer(s)) of the housing 102, the lid 104 and/or the collar 106 to form a weld(s) that hermetically seals the electronic components within the cavity 136 of the housing 102. In some examples, the housing 102, the lid 104 and the collar 106 are each made of the same and/or a similar material (e.g., thermoplastic material, liquid crystal polymer(s)). In other examples, the housing 102, the lid 104 and the collar 106 are made of different materials.

While the above examples disclose an example spin welding procedure to produce end points to be used in connection with utility meters, the example spin welding procedure can be more generally applied to any application where there is a desire to spin weld three components together (e.g., a housing, a lid, and a collar) where two of the three components must remain stationary while forming a hermetically sealed container.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method, comprising:
disposing a first flange of a lid within a groove of a housing, the groove defined by first and second walls of the housing;
disposing a second flange of a collar within the groove, the second flange positioned between the first flange and the first wall;
securing the housing and the lid relative to one another; and
spin welding the housing, the lid, and the collar.

2. The method of claim 1, further comprising, prior to disposing the first flange in the groove, positioning electronic components within a cavity defined by the housing.

3. The method of claim 2, wherein the electronic components comprise one or more of a controller, a memory, a transmitter, a receiver, or a battery.

4. The method of claim 1, wherein spin welding the housing, the lid, and the collar, comprises forming a first coupling between the first flange and the second flange and forming a second coupling between the second flange and the first wall.

5. The method of claim 1, wherein spin welding the housing, the lid, and the collar, comprises rotating the second flange of the collar within the groove and engaging respective ones of chamfers of the second flange against the housing and the lid to couple the collar to the housing and to couple the collar to the lid.

6. The method of claim 1, wherein the collar comprises a distal end to enable coupling with a rotary device.

7. The method of claim 1, wherein spin welding the housing, the lid, and the collar forms a hermetically sealed end point.

8. The method of claim 7, wherein the hermetically sealed end point comprises a water based end point.

9. The method of claim 1, wherein securing the housing and the lid relative to one another comprising positioning a protrusion of the lid within a groove of the housing to rotationally secure the lid relative to the housing.

10. The method of claim 1, further comprising, prior to disposing the first flange in the groove, disposing a sealant within the groove.

11. The method of claim 1, wherein the second flange comprises a chamfer.

* * * * *